(12) United States Patent
Hsu et al.

(10) Patent No.: US 8,153,498 B2
(45) Date of Patent: Apr. 10, 2012

(54) DOWNSIZE POLYSILICON HEIGHT FOR POLYSILICON RESISTOR INTEGRATION OF REPLACEMENT GATE PROCESS

(75) Inventors: Chen-Pin Hsu, Taoyuan (TW); Chung-Long Cheng, Baoshan Township, Hsinchu County (TW); Kong-Beng Thei, Pao-Shan Village (TW); Harry Chuang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 390 days.

(21) Appl. No.: 12/401,876

(22) Filed: Mar. 11, 2009

(65) Prior Publication Data
US 2010/0052058 A1    Mar. 4, 2010

Related U.S. Application Data

(60) Provisional application No. 61/092,899, filed on Aug. 29, 2008.

(51) Int. Cl.
*H01L 21/8232* (2006.01)
(52) U.S. Cl. ........ 438/382; 438/197; 438/199; 438/585; 438/591; 438/926; 257/E21.048
(58) Field of Classification Search ........... 257/E21.048; 438/197, 199, 382, 585, 591, 926
See application file for complete search history.

(56) References Cited

U.S. PATENT DOCUMENTS

| 5,731,239 | A  | * | 3/1998  | Wong et al.    | 438/296 |
| 6,333,223 | B1 | * | 12/2001 | Moriwaki et al.| 438/241 |
| 6,406,956 | B1 | * | 6/2002  | Tsai et al.    | 438/201 |
| 2008/0093675 | A1 | * | 4/2008 | Yao et al.    | 257/384 |
| 2009/0283835 | A1 | * | 11/2009 | Yu et al.    | 257/368 |

FOREIGN PATENT DOCUMENTS

CN    101232021    7/2008

OTHER PUBLICATIONS

Chinese Patent Office, Office Action dated Aug. 6, 2010, Application No. 200910163584, 4 pages.

* cited by examiner

*Primary Examiner* — Evan Pert
*Assistant Examiner* — Eduardo A Rodela
(74) *Attorney, Agent, or Firm* — Haynes and Boone, LLP

(57) ABSTRACT

A semiconductor device and method for fabricating a semiconductor device protecting a resistive structure in gate replacement processing is disclosed. The method comprises providing a semiconductor substrate; forming at least one gate structure including a dummy gate over the semiconductor substrate; forming at least one resistive structure including a gate over the semiconductor substrate; exposing a portion of the gate of the at least one resistive structure; forming an etch stop layer over the semiconductor substrate, including over the exposed portion of the gate; removing the dummy gate from the at least one gate structure to create an opening; and forming a metal gate in the opening of the at least one gate structure.

17 Claims, 5 Drawing Sheets

DOWNSIZE POLYSILICON HEIGHT FOR POLYSILICON RESISTOR INTEGRATION OF REPLACEMENT GATE PROCESS

PRIORITY DATA

This application claims priority to Provisional Application Ser. No. 61/092,899, filed on Aug. 29, 2008, entitled "DOWNSIZE POLYSILICON HEIGHT FOR POLYSILICON RESISTOR INTEGRATION OF REPLACEMENT GATE PROCESS," the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. However, problems arise when integrating a high-k/metal gate feature in a CMOS process flow due to various factors such as incompatibility of materials, complex processes, and thermal budgets.

For example, polysilicon resistors have been widely used in conventional integrated circuit design, including for RC oscillators, current limitation resistance, ESD protect, RF post drivers, on-chip termination, impedance matching, etc. Also, polysilicon electronic fuses (eFuses) have also been widely used in conventional memory integrated circuit design. However, integrating high-k metal gate technology with these types of devices has been challenging. In some situations, the polysilicon resistors and polysilicon eFuses may exhibit a lower than desirable resistivity following fabrication (i.e., due to affects from gate replacement processing, such as gate fill and chemical mechanical polishing processes), and thus these devices may be ineffective for their intended function.

Accordingly, what is needed are semiconductor devices that address the above stated issues, and methods for making such semiconductor devices.

SUMMARY

A semiconductor device and method for fabricating a semiconductor device protecting a resistive structure in a gate replacement process is disclosed. In one embodiment, a method for fabricating a semiconductor device comprises providing a semiconductor substrate; forming at least one gate structure including a dummy gate over the semiconductor substrate; forming at least one resistive structure including a gate over the semiconductor substrate; exposing a portion of the gate of the at least one resistive structure; forming an etch stop layer over the semiconductor substrate, including over the exposed portion of the gate; removing the dummy gate from the at least one gate structure to create an opening; and forming a metal gate in the opening of the at least one gate structure.

In one embodiment, a method for fabricating a semiconductor device comprises providing a semiconductor substrate having a first region and a second region; forming at least one gate structure in the first region over the semiconductor substrate, wherein the gate structure includes a gate dielectric layer, a dummy poly gate, and a hard mask layer; and forming at least one resistive structure in the second region over the semiconductor substrate, wherein the resistive structure comprises a dielectric layer, a poly gate, and a hard mask layer. The method may further comprise removing the hard mask layer from the resistive structure to create an opening and expose a portion of the poly gate; forming an etch stop layer over the semiconductor substrate including within the opening and over the exposed portion of the poly gate; removing the dummy poly gate and the hard mask layer from the gate structure to create an opening; and forming a metal gate in the opening in the gate structure.

In one embodiment, a semiconductor device protecting a resistive structure in the replacement gate process comprises a semiconductor substrate including a first region and a second region; a gate structure disposed over the semiconductor substrate in the first region, the gate structure including a metal gate; and the resistive structure disposed over the semiconductor substrate in the second region, the resistive structure including a poly gate and an etch stop layer disposed over the poly gate.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for only illustration purposes. In fact, the dimensions of the various features may be arbitrarily increased or reduced for clarity of discussion.

DETAILED DESCRIPTION

Figure 1:
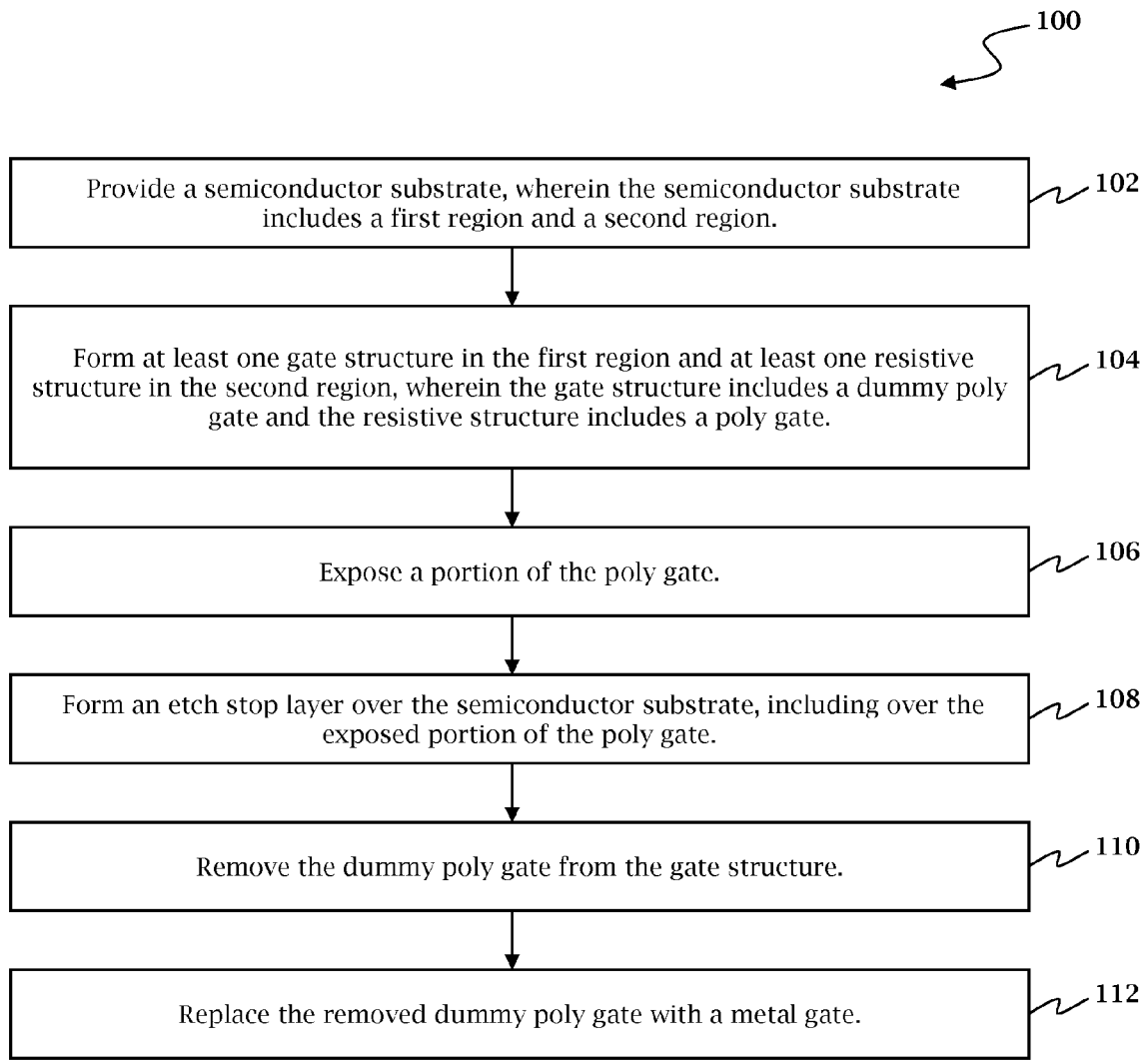
FIG. 1 is a flow chart of a method for fabricating a semiconductor device according to aspects of the present invention.

The present disclosure relates generally to methods for manufacturing semiconductor devices, and more particularly, to a method for manufacturing a semiconductor device providing protection for a resistive structure during gate replacement processing.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2A:
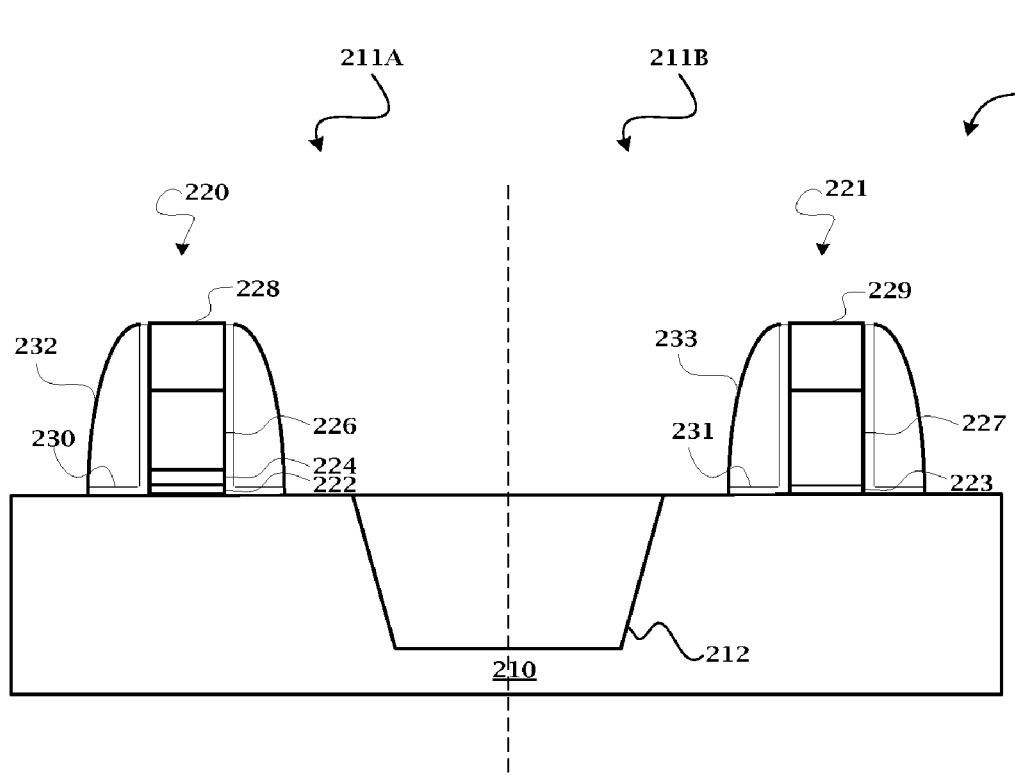
FIGS. 2A-2G are various cross-sectional views of embodiments of a semiconductor device during various fabrication stages according to the method of FIG. 1.
Figure 2B:
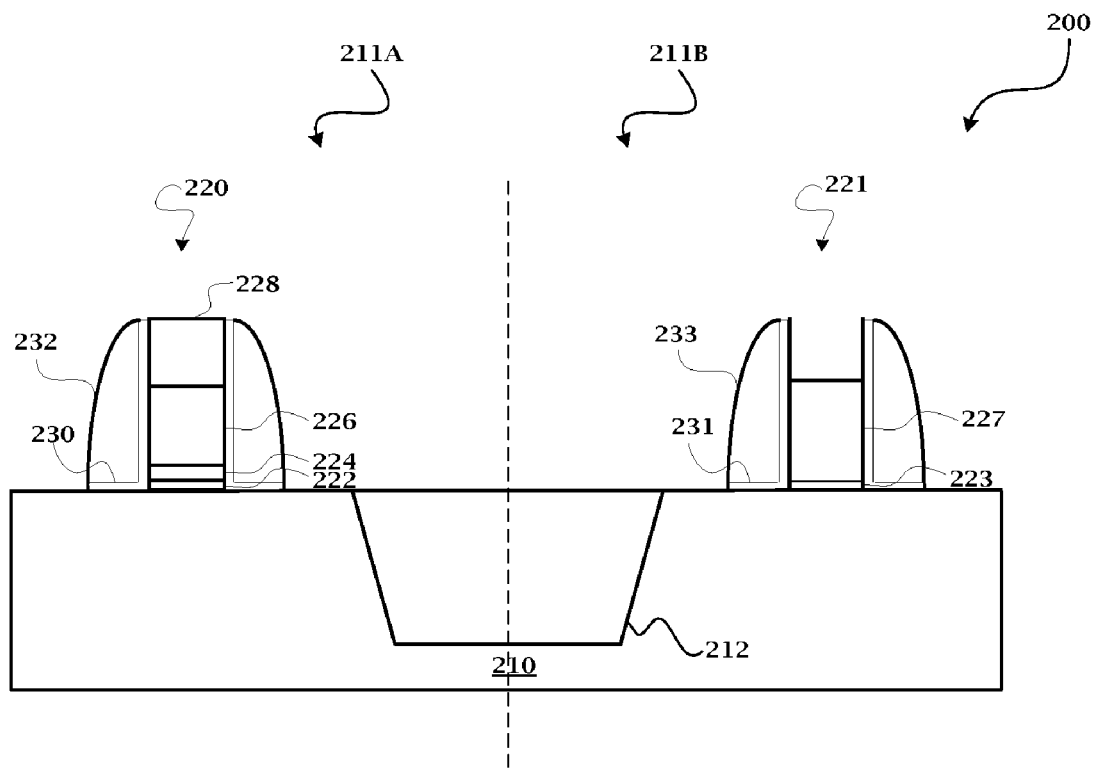
Figure 2C:
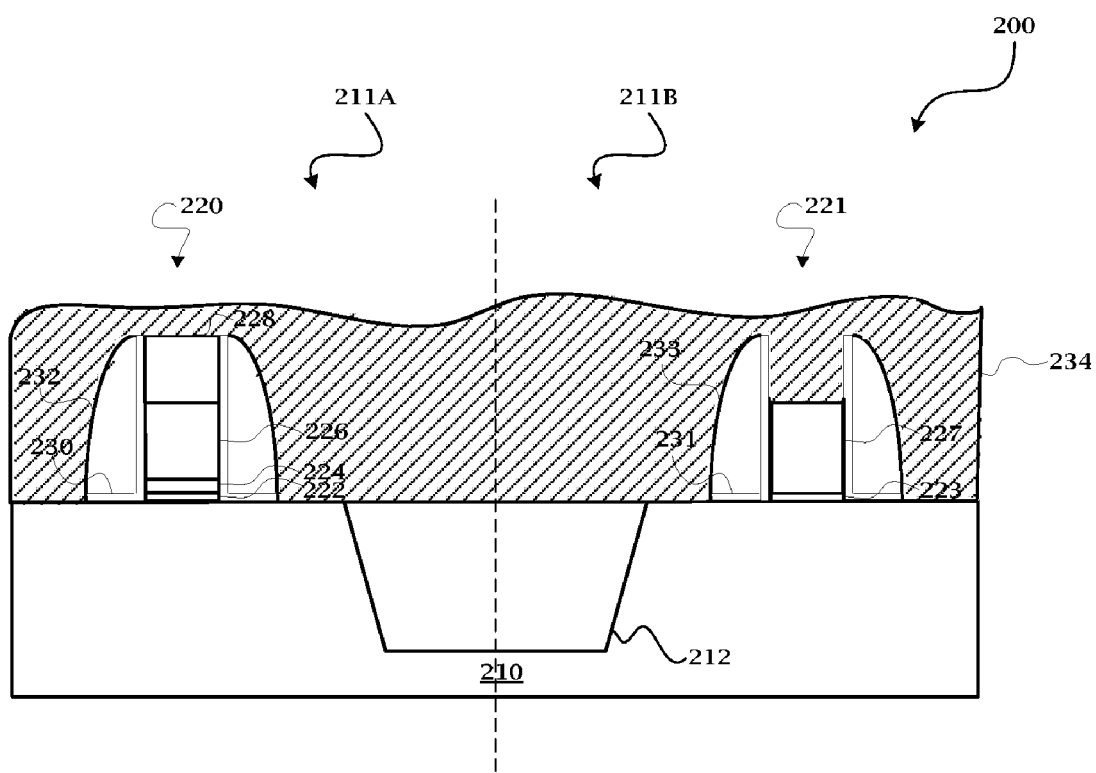
Figure 2D:
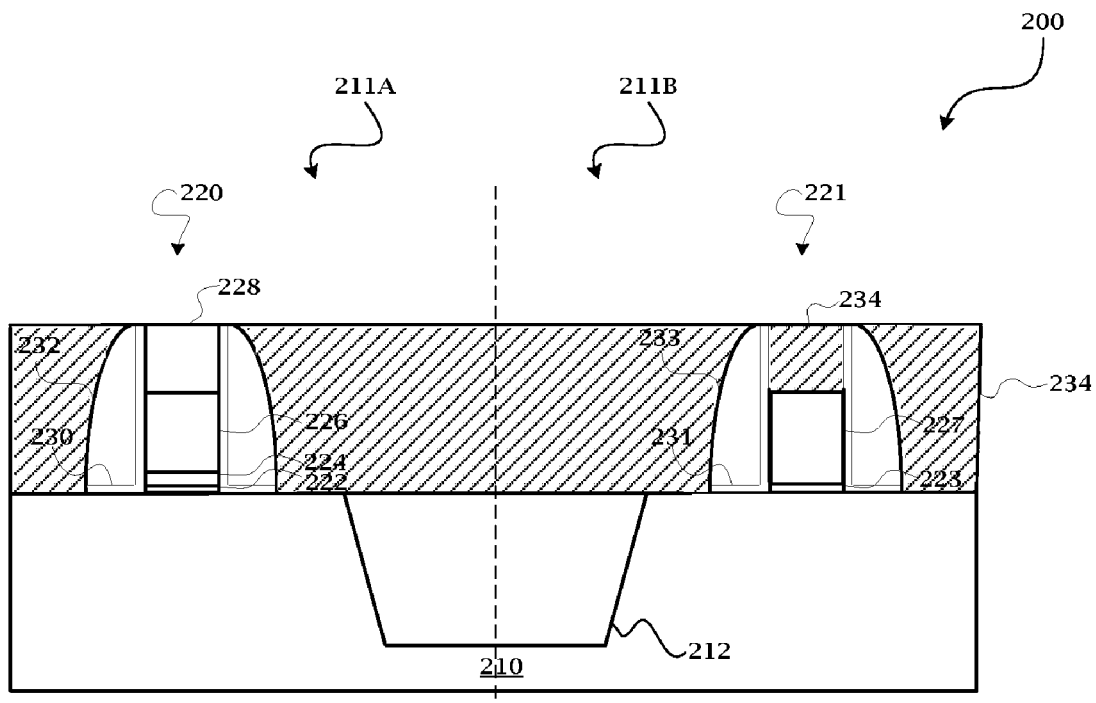
Figure 2E:
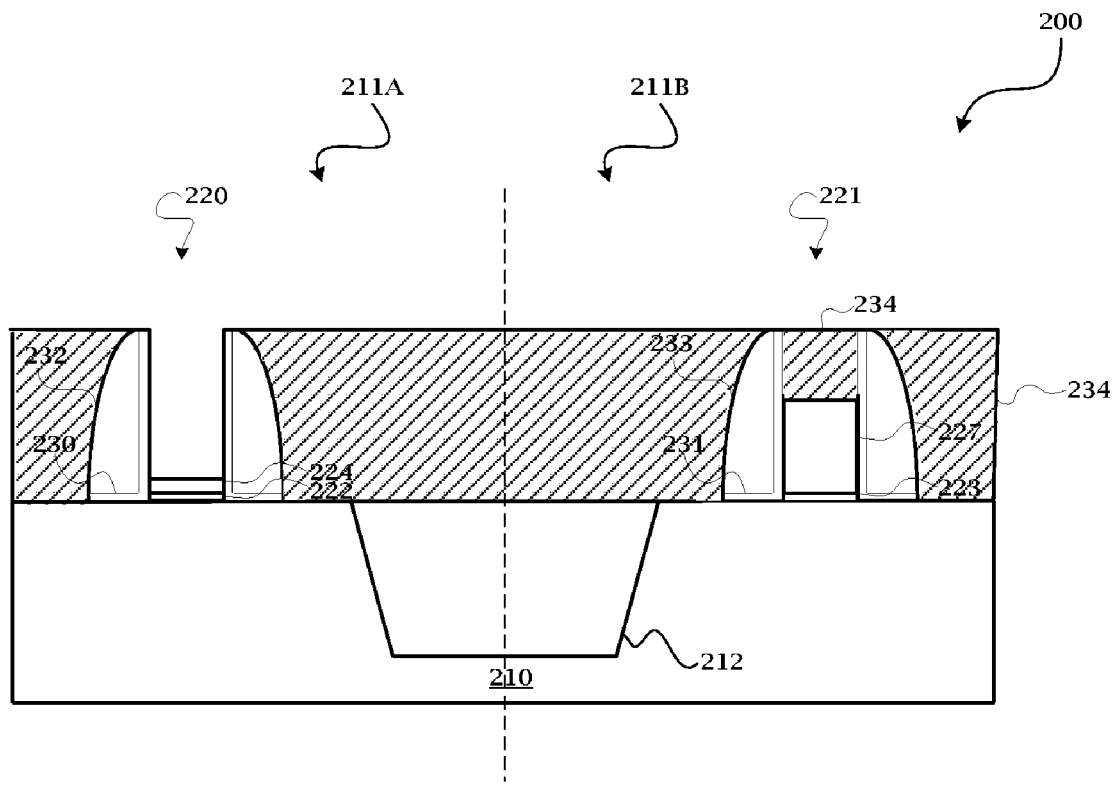
Figure 2F:
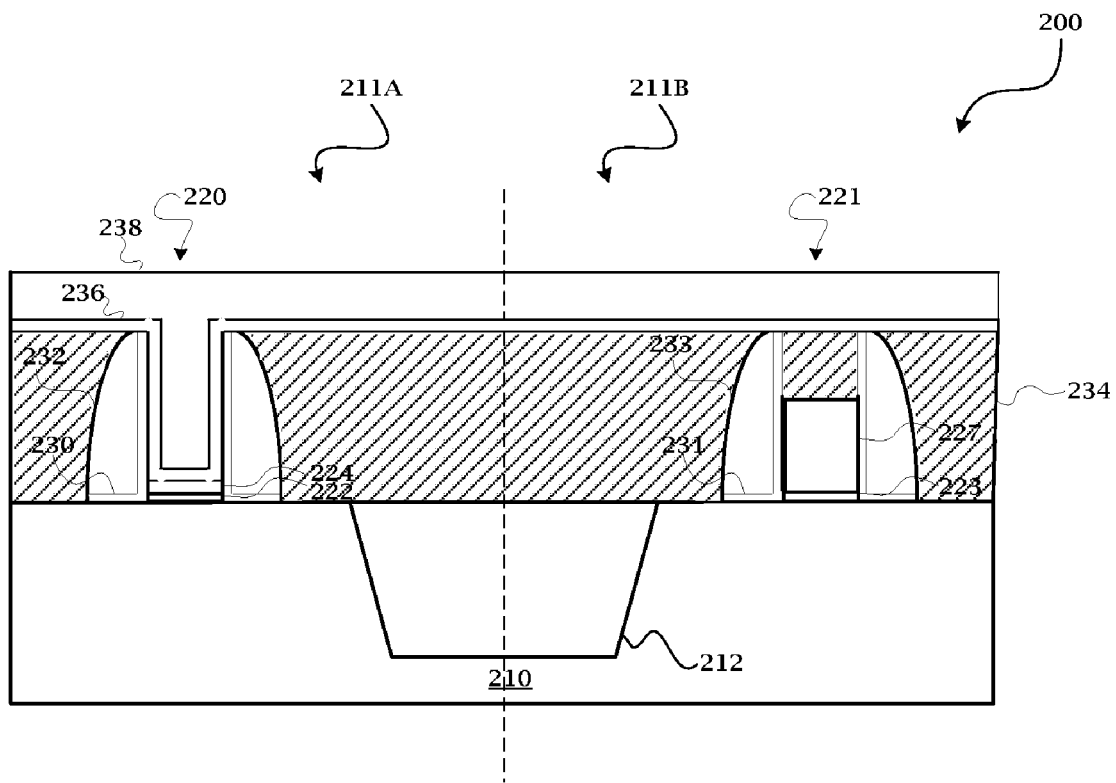
Figure 2G:
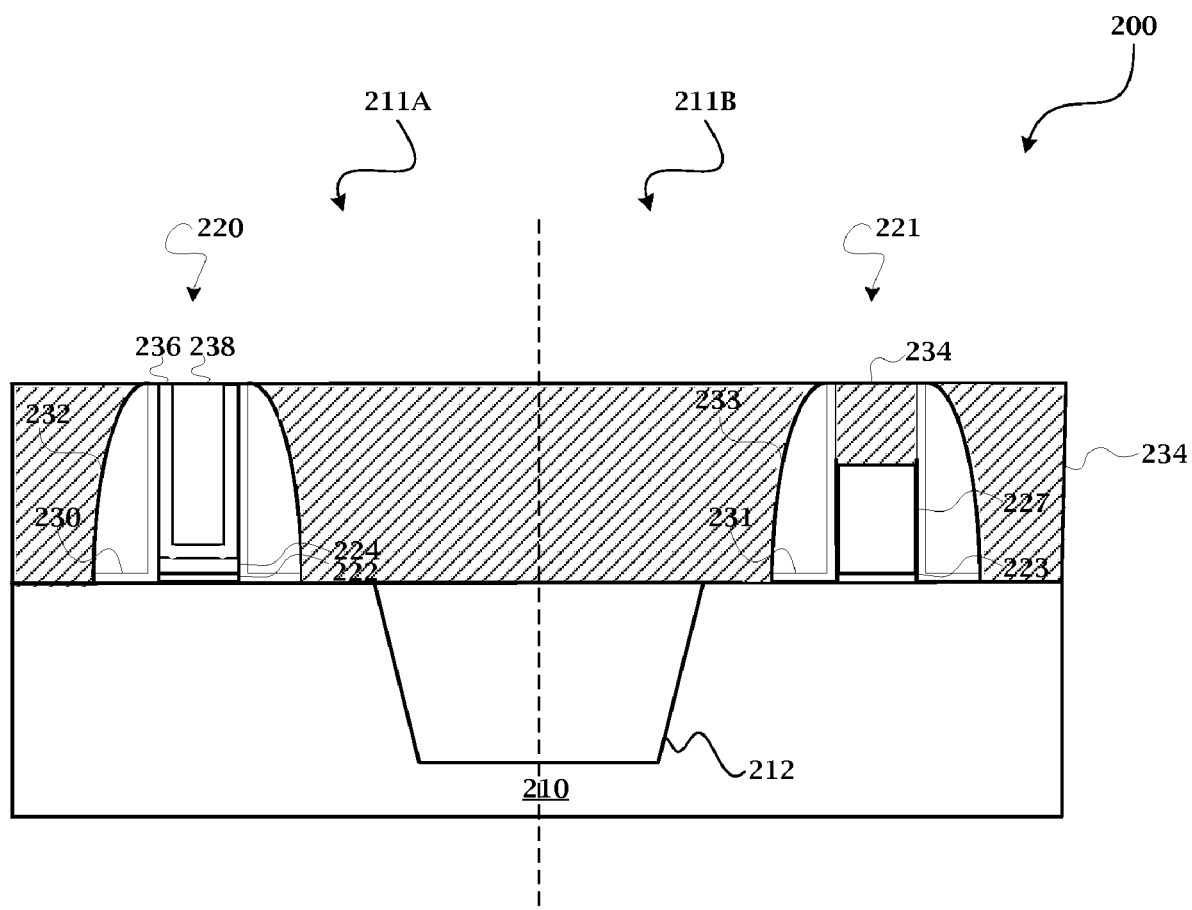

With reference to FIGS. 1 through 2G, a method 100 and a semiconductor device 200 are collectively described below. FIG. 1 is a flow chart of one embodiment of the method 100 for making the semiconductor device 200. FIGS. 2A-2G are various cross-sectional views of the semiconductor device 200 according to one embodiment, in portion or entirety, during various fabrication stages of the method 100. It is understood that additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200. The present embodiment of method 100 and semiconductor device 200 provides protection for a resistive structure during gate replacement processing, preventing the resistivity of the resistive structure from being negatively affected.

The semiconductor device 200 may be fabricated in a hybrid process including a gate first process and a gate last process. In the gate first process, a metal gate structure may be formed first and may be followed by a CMOS process flow to fabricate the final device. In the gate last process, a dummy poly gate structure may be formed first and may be followed by a normal CMOS process flow until deposition of an interlayer dielectric (ILD), and then the dummy poly gate structure may be removed and replaced with a metal gate structure. In the hybrid gate process, a metal gate structure of one type of device may be formed first and a metal gate structure of another type of device may be formed last.

Referring to FIGS. 1 and 2A, the method 100 begins at step 102 wherein a semiconductor substrate 210 including first region 211A and second region 211B is provided. The semiconductor substrate 210 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the silicon substrate may include a multilayer compound semiconductor structure.

In the present embodiment, the first region 211A comprises at least one active region, and the second region 211B comprises at least one passive region. The active region may include a variety of active microelectronic devices in various embodiments, such as P-channel field effect transistors (PFETs), N-channel field effect transistors (NFETs), metal-oxide semiconductor field effect transistors (MOSFETs), complementary metal-oxide semiconductor transistors (CMOSs), bipolar transistors, high voltage transistors, high frequency transistors, memory cells, other suitable active devices, and/or combinations thereof. The passive region may include a variety of passive microelectronic devices in various embodiments, such as resistors, capacitors, inductors, fuses, other suitable components, and/or combinations thereof. In the present embodiment, the method 100 will form a metal gate within the first region 211A and a resistor within the second region 211B.

The semiconductor device 200 includes at least one isolation region 212 formed on the semiconductor substrate 210. The isolation region 212 may utilize isolation technology, such as local oxidation of silicon (LOCOS) or shallow trench isolation (STI), to define and electrically isolate the various first regions 211A and second regions 211B. In the present embodiment, the isolation region 212 includes a STI. The isolation region 212, and in the present embodiment, the STI, may be formed by any suitable process. As one example, the formation of an STI may include patterning the semiconductor substrate by a conventional photolithography process, etching a trench in the substrate (for example, by using a dry etching, wet etching, and/or plasma etching process), and filling the trench (for example, by using a chemical vapor deposition process) with a dielectric material, such as silicon oxide, silicon nitride, silicon oxynitride, fluoride-doped silicate glass (FSG), a low-K dielectric material, other suitable materials, and/or combinations thereof. In some embodiments, the filled trench may have a multi-layer structure such as a thermal oxide liner layer filled with silicon nitride or silicon oxide. In another example, the STI may be created using a processing sequence as follows: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical polishing (CMP) processing to etch back and planarize, and using a nitride stripping process to remove the silicon nitride.

The method 100 proceeds to step 104 by forming at least one gate structure 220 within the first region 211A and forming at least one resistive structure 221 within the second region 211B. It is understood that a plurality of gate structures 220 and resistive structures 221 may be formed. The gate structure 220 and resistive structure 221 are disposed over the semiconductor substrate 210. In the present embodiment, the gate structure 220 includes a gate dielectric layer 222, a conductive layer 224, a dummy poly gate 226, a hard mask layer 228, gate spacer liners 230, and gate spacers 232. The resistive structure 221 includes a dielectric layer 223, poly gate 227, a hard mask layer 229, gate spacer liners 231, and gate spacers 233. In the present embodiment, the gate structure 220 and the resistive structure 221 lie in substantially the same plane, i.e., the gate structure 220 and the resistive structure 221 are disposed over a coplanar surface of the semiconductor substrate 210. In some embodiments, the gate structure 220 and the resistive structure 221 may lie in substantially different planes, i.e., a top surface of the gate structure 220 is not level with a top surface of the resistive structure 221.

The at least one gate structure 220 and the at least one resistive structure 221 may be formed by any suitable process. For example, the structures 220, 221 may be formed by conventional deposition, photolithography patterning, and etching processes, and/or combinations thereof. The deposition processes may include chemical vapor deposition (CVD), physical vapor deposition (PVD), atomic layer deposition (ALD), sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof. It is understood that the structures 220, 221 may be formed by any combination of the processes described above. It is further understood that the gate structure 220 and the resistive structure 221 may be formed simultaneously, utilizing the same processing steps and processing materials; the gate structure 220 and the resistive structure 221 may be formed independently of one another, utilizing varying processing steps and processing materials; or the gate structure 220 and the resistive structure 221 may be formed using a combination of simultaneous and independent processing steps and processing materials.

The gate dielectric layer 222 and dielectric layer 223 is disposed on the semiconductor substrate 210. The gate dielectric layer 222 and dielectric layer 223 may be any suitable dielectric material. The dielectric layers 222, 223 may further include a multilayer structure comprising multiple dielectric materials. Preferably, the dielectric material will have relatively high integrity and low current leakage. In the present embodiment, the gate dielectric layer 222 and the dielectric layer 223 comprise a high-k dielectric material. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, $HfO_2$, HfSiO, HfSiON, HfTaO, HfTaTiO, HfTiO, HfZrO, HfAlON, and/or combinations thereof. Examples of the dielectric material further include silicon oxide, silicon nitride, silicon oxynitride, hafnium oxide, zirconium oxide, titanium oxide, aluminum oxide, hafnium dioxide-alumina ($HfO_2$—$Al_2O_3$) alloy, other suitable high-k dielectric materials, and/or combinations thereof. In some embodiments, the gate dielectric layer 222 and the dielectric layer 223 may comprise a layer of silicon dioxide and a layer of high-k dielectric material. Further, the dielectric layers 222, 223 may be doped polycrystalline silicon with the same or different doping. The dielectric layers 222, 223 may be formed using CVD, PVD, ALD, thermal oxide, plating, other suitable processes, and/or combinations thereof.

The conductive layer 224 of the gate structure 220 is disposed over the gate dielectric layer 222. The conductive layer 224 may be any suitable material. In the present embodiment, the conductive layer 224 comprises metal, such as aluminum, copper, tungsten, titanium, tantalum, titanium nitride, tantalum nitride, nickel silicide, cobalt silicide, other suitable materials, and/or combinations thereof. The conductive layer 224 may further include a multilayer structure comprising multiple materials. Further, the conductive layer 224 may be doped polycrystalline silicon with the same or different doping. The conductive layer 224 may be formed using CVD, PVD, ALD, thermal oxide, plating, other suitable processes, and/or combinations thereof. It is understood that, in some embodiments, the resistive structure 221 may also comprise a conductive layer.

The dummy poly gate 226 of the gate structure 220 is disposed over the conductive layer 224. The poly gate 227 of the resistive structure 221 is disposed over the semiconductor substrate 210. The dummy poly gate 226 and poly gate 227 may comprise polycrystalline silicon; silicon-containing materials; germanium-containing materials; metal, such as aluminum, copper, tungsten, titanium, tantalum, titanium nitride, tantalum nitride, nickel silicide, cobalt silicide; other proper conductive materials; and/or combinations thereof. In the present embodiment, dummy poly gate 226 and poly gate 227 comprise polycrystalline silicon (i.e., polysilicon). It is understood that, in alternate embodiments, the dummy poly gate 226 and poly gate 227 may comprise other suitable materials and may comprise multilayer structures. The poly gates 226, 227 may be formed by CVD, PVD, ALD, thermal oxide, plating, other suitable processes, and/or combinations thereof.

In the present embodiment, the hard mask layers 228, 229 are disposed over the dummy poly gate 226 and the poly gate 227, respectively. In the present embodiment, the hard mask layers 228, 229 comprise a nitrogen-containing material, such as silicon nitride, silicon oxynitride, other suitable nitrogen-containing materials, and/or combinations thereof. In alternate embodiments, the hard mask layers may include an amorphous carbon material, silicon carbide, other suitable dielectric materials, and/or combinations thereof. The hard mask layers 228, 229 may be formed by any suitable process, such as PVD, CVD, plasma-enhanced CVD, rapid thermal CVD, ALD, metal-organic CVD, other suitable processes, and/or combinations thereof. The hard mask layers 228, 229 may include a single layer or multiple layers. Further, the hard mask layers 228, 229 comprise any suitable thickness. It is understood that the hard mask layers 228, 229 may comprise similar or different compositions, thicknesses, etc.

The gate structure 220 further includes the gate spacer liners 230 and gate spacers 232, and the resistive structure 221 further includes the spacer liners 231 and spacers 233. The gate spacer liners 230 and spacer liners 231 may comprise any suitable material and be formed by any suitable process. In the present embodiment, the gate spacer liners comprise a spacer oxide. In alternate embodiments, the spacer liners 230, 231 may be omitted entirely. Still, in other embodiments, the spacer liners 230, 231 may comprise multiple layers. The gate spacers 232, which are positioned on each side of the gate structure 220, and the spacers 233, which are positioned on each side of the resistive structure 221, may comprise a dielectric material, such as silicon nitride, silicon oxide, silicon carbide, silicon oxynitride, other suitable materials, or combinations thereof. In some embodiments, the gate spacers 232 and spacers 233 may comprise a multilayer structure. The spacers 232, 233 may be formed by depositing the dielectric material by CVD, ALD, PVD, and/or other suitable processes and then etching.

It is understood that the gate structure 220 and the resistive structure 221 may comprise additional layers above and below poly gates 226, 227. For example, the structures 220, 221 may comprise interfacial layers, capping layers, diffusion/barrier layers, dielectric layers, metal layers, other suitable layers, and/or combinations thereof. Also, the semiconductor device 200 may include antireflective coating layers or bottom antireflective coating layers. It is further understood that the structures 220, 221 may undergo further CMOS or MOS technology processing to form various features known in the art. For example, in some embodiments, lightly doped regions (referred to as LDD regions) may be formed in the substrate 210 using any suitable process, such as ion implantation, and any suitable dopants. In another example, source and drain regions (referred to as S/D regions) may be formed in the substrate 210 using ion implantation or diffusion with suitable dopants (depending on the configuration of the device such as NMOS and PMOS) and located proximate to each end of the structures 220, 221, respectively. Also, in some embodiments, the LDD regions, S/D regions, gate structure 220, and/or resistive structure 221 may comprise silicide regions including any suitable composition.

As noted above, the gate structures and resistive structures may be formed simultaneously or independently, often through similar processing. In replacement gate technology, processing oftentimes includes forming the metal gate in place of the dummy poly gate by implementing a gate fill process (e.g., replacing the dummy poly gate with metal layer(s)) and a metal chemical mechanical polish process (CMP). For example, the dummy poly gate 226 and the hard mask layer 228 of the gate structure 220 may be removed so that a true metal gate may be formed in place of the dummy poly gate 226, while the resistive structure 221 including the poly gate 227 is covered by a mask. However, it has been observed that following the gate fill process and metal CMP process there may be some over-polishing (or dishing effect) on the top electrode (the poly gate 227) of the resistive structure 221 in region 211B. The over-polishing or dishing effect may be caused by the different pattern structures and pattern densities in region 211A as compared to region 211B. Further, such processes negatively affect the resistance of the resistive structure 221.

Accordingly, the present invention provides a method wherein the resistive structure 221, particularly the poly gate 227, is protected from replacement gate processing, such as the gate fill and metal CMP processes. The protection for the resistive structure 221 is easily integrated with current gate replacement technology, presents minimal additional costs, and provides protection to the resistive structure 221 without complicated additional processing. Specifically, the present invention forms the dummy poly gate 226 and poly gate 227 with reduced thicknesses and provides an etch stop layer for protecting the poly gate 227 during subsequent processing, such as the gate fill and metal CMP processes.

For example, in the present embodiment, at step 104, when the dummy poly gate 226 and the poly gate 227 are formed, the poly gates 226, 227 are deposited at a reduced thickness, wherein the height of the poly gates 226, 227 is substantially less than the height of the gate structure 220 and resistive structure 221 as illustrated in FIG. 2A. More particularly, a top surface of the dummy poly gate 226 and a top surface of the poly gate 227 is substantially recessed from a top surface of the gate structure 220 and a top surface of the resistive structure 221. In some embodiments, the poly gates 226, 227 comprise a thickness ranging between approximately 200 Å and 400 Å. In some embodiments, the hard mask layers 228, 229 comprise a thickness of approximately 1200 Å.

Referring to FIGS. 1 and 2B, at step 106, a portion of the poly gate 227 of the resistive structure 221 is exposed. In the present embodiment, a top surface of the poly gate 227 is exposed by removing the hard mask layer 229 disposed over the resistive structure 221. The hard mask layer 229 may be removed by any suitable process. For example, removing the hard mask layer 229 may include forming a photoresist layer over the semiconductor device; patterning the photoresist layer by a conventional photolithography process; and etching the photoresist layer to remove the hard mask layer 229. Subsequently, the photoresist layer may be removed.

Referring to FIGS. 1 and 2C, an etch stop layer (ESL) 234 is formed over the semiconductor device 200 in step 108, and specifically, the ESL 234 is formed over the exposed portion of the poly gate 227. The ESL layer 234 protects the poly gate 227 of the resistive structure 221 during subsequent replacement gate processing, such as the gate fill and metal CMP processes, which typically causes over-polishing and/or dishing effects on the poly gate 227. The ESL 234 may include silicon nitride, silicon oxynitride, and/or other suitable materials. The ESL 234 composition may be selected based upon etching selectivity to one or more additional features of the semiconductor device 200. In the present embodiment, the ESL 234 is a contact etch stop layer (CESL) comprising silicon nitride. After deposition, the ESL 234 may be planarized by a CMP process until a top portion of the hard mask layer 228 overlying the dummy poly gate 226 is exposed as illustrated in FIG. 2D. The CMP process may have a high selectivity to provide a substantially planar surface for the gate structure, resistive structure, and ESL. The CMP process may also have low dishing and/or metal erosion effect. Additionally, it should be noted that the reduced thickness of the poly gate 227 allows the ESL 234 to remain disposed over the poly gate 227 after the CMP process, wherein the ESL 234 will further remain disposed over the poly gate 227 when the true metal gate of the gate structure 220 is formed as discussed below.

Referring to FIGS. 1 and 2E, at step 110, the dummy poly gate 226 of gate structure 220 is removed. In the present embodiment, the hard mask layer 228 overlying the dummy poly gate 226 of gate structure 220 is also removed. The hard mask layer 228 and dummy poly gate 226 may be removed by any suitable process. For example, removing the hard mask layer 228 and dummy poly gate 226 may include forming a photoresist layer over the semiconductor device; patterning the photoresist layer by a conventional photolithography process; and etching the photoresist layer to remove the hard mask layer. Subsequently, the photoresist layer may be removed. In another example, the hard mask layer 228 and dummy poly gate 226 may be removed by an etching process that selectively etches hard mask layer 228 and dummy poly gate 226 as is known in the art.

At step 112, referring to FIGS. 1 and 2F, the removed dummy poly gate 226 is replaced with a metal gate. In one example, metal material layer(s) may be formed over the substrate 210 filling in the openings that were created by the removal of the dummy poly gate 226 in region 211A. In the present embodiment, a first metal layer 236 is formed over the semiconductor device 200, and a second metal layer 238 is formed over the first metal layer 236. As shown in FIG. 2F, the metal layers 236, 238 fill the openings created in the gate structure 220 where the dummy poly gate 226 was removed. The metal layers 236, 238 may comprise any suitable material, such as copper, tungsten, titanium, tantalum, titanium nitride, tantalum nitride, nickel silicide, cobalt silicide, metal carbides, metal nitrides, doped-conducting metal oxides, dielectric materials, and/or combinations thereof.

The metal layers 236, 238 may be formed by any suitable process. For example, the metal layers 236, 238 may be formed by conventional deposition, photolithography patterning, and etching processes, and/or combinations thereof. The deposition processes may include PVD, CVD, ALD, sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof. It is understood that the metal layers 236, 238 may be formed by any combination of the processes described above.

After deposition, the metal layers 236, 238 may be planarized by a metal CMP process to provide a substantially planar surface as illustrated in FIG. 2G. The CMP process may have a high selectivity to provide a substantially planar surface for the gate structure, resistive structure, and ESL. The CMP process may also have low dishing and/or metal erosion effect. It should be noted that, in the present embodiment, the ESL 234 disposed over the poly gate 227 protects the poly gate 227 from being affected (e.g., the resistance of the resistive structure does not change) by the gate fill and metal CMP processes discussed above. Incorporation of the ESL 234 protection feature integrates easily into current gate replacement processing and eliminates the complicated extra processing steps conventionally utilized to protect the resistive structure 221, particularly the poly gate 227, from gate fill and metal CMP processes. It is understood that the semiconductor device 200 may undergo further CMOS or MOS technology processing to form various features known in the art. In still another example, various contacts/vias and multilayer interconnect features (e.g., metal layers and interlayer dielectrics) may be formed on the substrate 210 and configured to connect the various features or structures of the semiconductor device 200.

Overall, the disclosed embodiments provide one or more of the following advantages: (1) protection for a resistive structure during gate replacement processing; (2) the gate of the resistive structure is downsized; (3) providing protection for the resistive structure is easily integrated into current gate replacement processing; (4) providing protection for the resistive structure prevents resistance from being affected by gate replacement processing, such as gate fill and metal chemical mechanical polish processes; (5) no complicated extra processing steps are required for protecting the resistive structures, such as providing a mask over the resistive structure; and (6) providing protection for the resistive structure results in minimal additional costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, the method comprising:
    providing a semiconductor substrate;
    forming a gate structure including a dummy gate over the semiconductor substrate;
    forming a resistive structure including a gate over the semiconductor substrate;
    exposing the gate of the resistive structure, wherein the exposing the gate includes removing a portion of the resistive structure such that an opening is formed in the resistive structure;
    forming an etch stop layer over the semiconductor substrate, wherein the etch stop layer fills the opening in the resistive structure such that the etch stop layer is disposed over the exposed gate;
    after forming the etch stop layer, removing the dummy gate from the gate structure such that an opening is formed in the gate structure; and
    forming a metal gate in the opening of the gate structure.

2. The method of claim 1 wherein forming the gate structure including the dummy gate and forming the resistive structure including the gate comprises forming the dummy gate and the gate wherein a top surface of the dummy gate and a top surface of the gate is substantially recessed from a top surface of the gate structure and a top surface of the resistive structure.

3. The method of claim 1 wherein forming the etch stop layer over the semiconductor substrate, including over the exposed gate, comprises performing a chemical mechanical polishing on the etch stop layer.

4. The method of claim 1 wherein forming the metal gate in the opening of the gate structure comprises:
    forming a first metal layer over the opening;
    forming a second metal layer over the first metal layer, wherein the first metal layer and the second metal layer fill the opening; and
    thereafter, performing a chemical mechanical polishing on the first metal layer and the second metal layer.

5. The method of claim 1 wherein the gate of the resistive structure and the dummy gate of the gate structure comprises polysilicon.

6. The method of claim 1 wherein the gate of the resistive structure comprises a thickness between approximately 200 Å and 400 Å.

7. The method of claim 1 wherein the etch stop layer comprises a contact etch stop layer including silicon nitride.

8. The method of claim 1 wherein forming the gate structure and forming the resistive structure comprises forming a dielectric layer between the semiconductor substrate and the dummy gate and a dielectric layer between the semiconductor substrate and the gate.

9. The method of claim 1 wherein exposing the gate of the resistive structure comprises removing a hard mask layer disposed over the gate.

10. The method of claim 1 wherein removing the dummy gate from the gate structure to create the opening in the gate structure comprises removing a hard mask layer disposed over the dummy gate.

11. A method for fabricating a semiconductor device, the method comprising:
    providing a semiconductor substrate having a first region and a second region;
    forming a gate structure in the first region over the semiconductor substrate, wherein the gate structure includes a high-k gate dielectric layer, a dummy poly gate, and a hard mask layer;
    forming a resistive structure in the second region over the semiconductor substrate, wherein the resistive structure includes a high-k dielectric layer, a poly gate, and a hard mask layer;
    removing the hard mask layer from the resistive structure to create a first opening and expose the poly gate;

forming an etch stop layer over the semiconductor substrate such that the hard mask layer of the gate structure is exposed and the etch stop layer fills the first opening;

after forming the etch stop layer, removing the dummy poly gate and the hard mask layer from the gate structure to create a second opening; and forming a metal gate in the second opening.

12. The method of claim 11 wherein forming the gate structure and forming the resistive structure comprises forming the dummy poly gate and the poly gate wherein a top surface of the dummy poly gate and a top surface of the poly gate is substantially recessed from a top surface of the gate structure and a top surface of the resistive structure.

13. The method of claim 11 wherein forming the etch stop layer over the semiconductor substrate such that the hard mask layer of the gate structure is exposed and the etch stop layer fills the first opening includes performing a chemical mechanical polishing on the etch stop layer.

14. The method of claim 11 wherein the etch stop layer comprises a contact etch stop layer including silicon nitride.

15. The method of claim 11 wherein forming the metal gate in the second opening comprises:

forming a first metal layer over the second opening;

forming a second metal layer over the first layer; and thereafter, performing a chemical mechanical polishing on the first metal layer and the second metal layer to planarize the gate structure.

16. The method of claim 11 wherein the hard mask layer comprises a thickness of approximately 1200 Å.

17. The method of claim 11 wherein the gate structure further comprises a conductive layer formed between the semiconductor substrate and the dummy poly gate.

* * * * *